(12) United States Patent
Wu et al.

(10) Patent No.: US 9,560,753 B2
(45) Date of Patent: Jan. 31, 2017

(54) LIGHT EMITTING DIODE LOAD BOARD AND MANUFACTURING PROCESS THEREOF

(71) Applicant: TM TECHNOLOGY, INC, Hsinchu (TW)

(72) Inventors: Ben Wu, Taipei (TW); Wen-Doe Su, Zhubei (TW)

(73) Assignee: TM TECHNOLOGY, INC., Hsinchu (TW)

( * ) Notice: Subject to any disclaimer, the term of this patent is extended or adjusted under 35 U.S.C. 154(b) by 0 days.

(21) Appl. No.: 15/016,212

(22) Filed: Feb. 4, 2016

(65) Prior Publication Data

US 2016/0309587 A1    Oct. 20, 2016

Related U.S. Application Data

(60) Provisional application No. 62/148,722, filed on Apr. 16, 2015.

(51) Int. Cl.

| | |
|---|---|
| *H05K 1/11* | (2006.01) |
| *H05K 1/02* | (2006.01) |
| *H05K 1/09* | (2006.01) |
| *H05K 3/46* | (2006.01) |

(Continued)

(52) U.S. Cl.
CPC .............. *H05K 1/0298* (2013.01); *H05K 1/09* (2013.01); *H05K 1/111* (2013.01); *H05K 3/0017* (2013.01); *H05K 3/4007* (2013.01); *H05K 3/4644* (2013.01); *H05K 2201/09036* (2013.01); *H05K 2201/10106* (2013.01); *H05K 2201/10242* (2013.01); *H05K 2203/0562* (2013.01)

(58) Field of Classification Search
CPC .. H05K 1/112; H05K 1/115; H05K 2201/096; H05K 3/3447; H05K 3/429; H05K 3/4038; H05K 3/4644
See application file for complete search history.

(56) References Cited

U.S. PATENT DOCUMENTS

| | | | |
|---|---|---|---|
| 2009/0133910 A1* | 5/2009 | Ohashi | H05K 3/0032 174/258 |
| 2010/0163297 A1* | 7/2010 | Kajihara | H05K 3/0032 174/264 |

(Continued)

*Primary Examiner* — Hoa C Nguyen
(74) *Attorney, Agent, or Firm* — Maschoff Brennan

(57) ABSTRACT

A light emitting diode load board includes a substrate, a first dielectric layer, a second dielectric layer and a first conductive pad and a second conductive pad. The second dielectric layer includes a first structure part, a second structure part and a third structure part. The first dielectric layer is disposed on the substrate. The first structure part is disposed on the first dielectric layer and has a first sidewall. The second structure part is disposed on the first structure part and has a second sidewall. The third structure part is disposed on the second structure part and has N sidewalls. The second sidewall is more prominent than the first sidewall. The first sidewall, the second sidewall and the N sidewalls define the first etched part, and the part of the first dielectric layer is exposed from the first etched part. The first conductive pad is disposed in the first etched part. The second conductive is disposed on the second dielectric layer, covers part of the second dielectric and exposes the open of the first etched part.

25 Claims, 20 Drawing Sheets

(51) Int. Cl.
*H05K 3/00* (2006.01)
*H05K 3/40* (2006.01)

(56) References Cited

U.S. PATENT DOCUMENTS

| | | | | |
|---|---|---|---|---|
| 2010/0254098 A1* | 10/2010 | Tsukada | ............ | H01L 23/49827 361/748 |
| 2010/0307809 A1* | 12/2010 | Noda | ................... | H05K 3/0032 174/266 |
| 2014/0216794 A1* | 8/2014 | Hibino | ................... | H05K 3/429 174/255 |

* cited by examiner

LIGHT EMITTING DIODE LOAD BOARD AND MANUFACTURING PROCESS THEREOF

CROSS-REFERENCE TO RELATED APPLICATIONS

This non-provisional application claims priority under 35 U.S.C. §119(a) on Patent Application No(s). 62/148,722 filed in the United States on Apr. 16, 2015, the entire contents of which are hereby incorporated by reference.

BACKGROUND

Technical Field

The disclosure relates to a light emitting diode (LED) load board and a manufacturing method thereof, more particularly to a LED load board with an alignment structure and a manufacturing method thereof.

Related Art

Generally, when LEDs are powered to emit light, the supplied power is partly used to emit light and partly converted into thermal energy. In practice, the luminous efficiency of a LED rapidly drops under the influence of a high temperature environment, so the LED wastes more power and also produces more heat, resulting in the increase of temperature. The LED then falls into a vicious spiral. Therefore, it would be better to load LEDs on a load board with a better thermal conductivity in order to avoid wasting power and a shorter lifespan.

Additionally, for the ease of manufacturing, modern LED load boards use a simple laminated structure without any design on the junction between the load board and LEDs, and such a concern about the junction between the load board and LEDs is left to a later assembling process. This will bring in a difficulty in the assembling process and also decrease the yield rate of the manufacturing of load boards.

SUMMARY

For this, the disclosure promotes a LED load board and a manufacturing method thereof in order to enhance the thermal conductivity of the LED load board during the manufacturing of the LED load board and meanwhile solve the problems in the aligning connection between LEDs and the load board.

According to one or more embodiments, the disclosure provides a LED load board. The LED load board includes a substrate, a first dielectric layer, a second dielectric layer, a first conductive pad and a second conductive pad. The second dielectric layer includes a first structure portion, a second structure portion and a third structure portion. The first dielectric layer is formed on the substrate. The first structure portion is formed on the first dielectric layer and includes a first sidewall. The second structure portion is formed on the first structure portion and includes a second sidewall. The second sidewall is more prominent than/protrudes from the first sidewall. Third structure portion is formed on the second structure portion and includes N pieces of sidewall. Even one of the N pieces of sidewall is more prominent than/protrudes from odd one of the N pieces of sidewall. The first sidewall, the second sidewall and the N pieces of sidewall constitute a first etched portion, which exposes a fraction of the first dielectric layer. The first conductive pad is formed in the first etched portion. The second conductive pad is formed on the second dielectric layer, covers a fraction of the second dielectric layer, and exposes openings of the first etched portion.

In an embodiment, the second structure portion and the first dielectric layer have a gap portion therebetween. The width of the gap portion is substantially equal to the thickness of the first structure portion. In an embodiment, the first conductive pad does not contact the first and second sidewalls. In an embodiment, the first structure portion is made of polysilicon, and the first structure portion and the second structure portion have a difference in material. In an embodiment, the insulation layer covers the openings of the first etched portion and exposes a fraction of the second conductive pad. In an embodiment, the LED load board further includes a conductive pillar, which has one terminal connecting to the second conductive pad, and has another terminal sticking out from the insulation layer.

Also, the disclosure provides a manufacturing method of a LED load board in one or more embodiments. In an embodiment, the manufacturing method includes the following steps. Form a first dielectric layer on a substrate, and form a second dielectric layer on the first dielectric layer. The second dielectric layer includes a first structure portion, a second structure portion, and an Nth structure portion. The first structure portion is between the second structure portion and the first dielectric layer. The first structure portion includes a first sidewall, the second structure portion includes a second sidewall, and the Nth structure portion includes an Nth sidewall. The second sidewall is more prominent than/protrudes from the first sidewall. The first, second and Nth sidewalls constitute a first etched portion, which exposes a fraction of the first dielectric layer. Then, form a first conductive pad on the first dielectric layer, and form a second conductive pad on either the second structure portion or the Nth structure portion.

In an embodiment, the manufacturing method may further include the following steps. Form an insulation layer on the second conductive pad. The insulation layer may cover the openings of the first etched portion and expose a fraction of the second conductive pad. Form a conductive pillar on the second conductive pad. One terminal of the conductive pillar contacts the second conductive pad, and another terminal of the conductive pillar sticks out from insulation layer.

As described above, the structure of the LED load board in the disclosure may not only avoid the interconnection between different conductive layers but also has conductive pillars at the interface with LEDs, and these conductive pillars are helpful to the aligning connection with LEDs. Moreover, in an embodiment polysilicon is used to form one of the constitution layers of the LED load board, so the thermal conductivity of the LED load board may be enhanced. Therefore, the LED load board and the manufacturing method thereof may enhance the efficiency of aligning and connecting the LED load board to LEDs and also enhance the thermal conductivity of the LED load board.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1A:
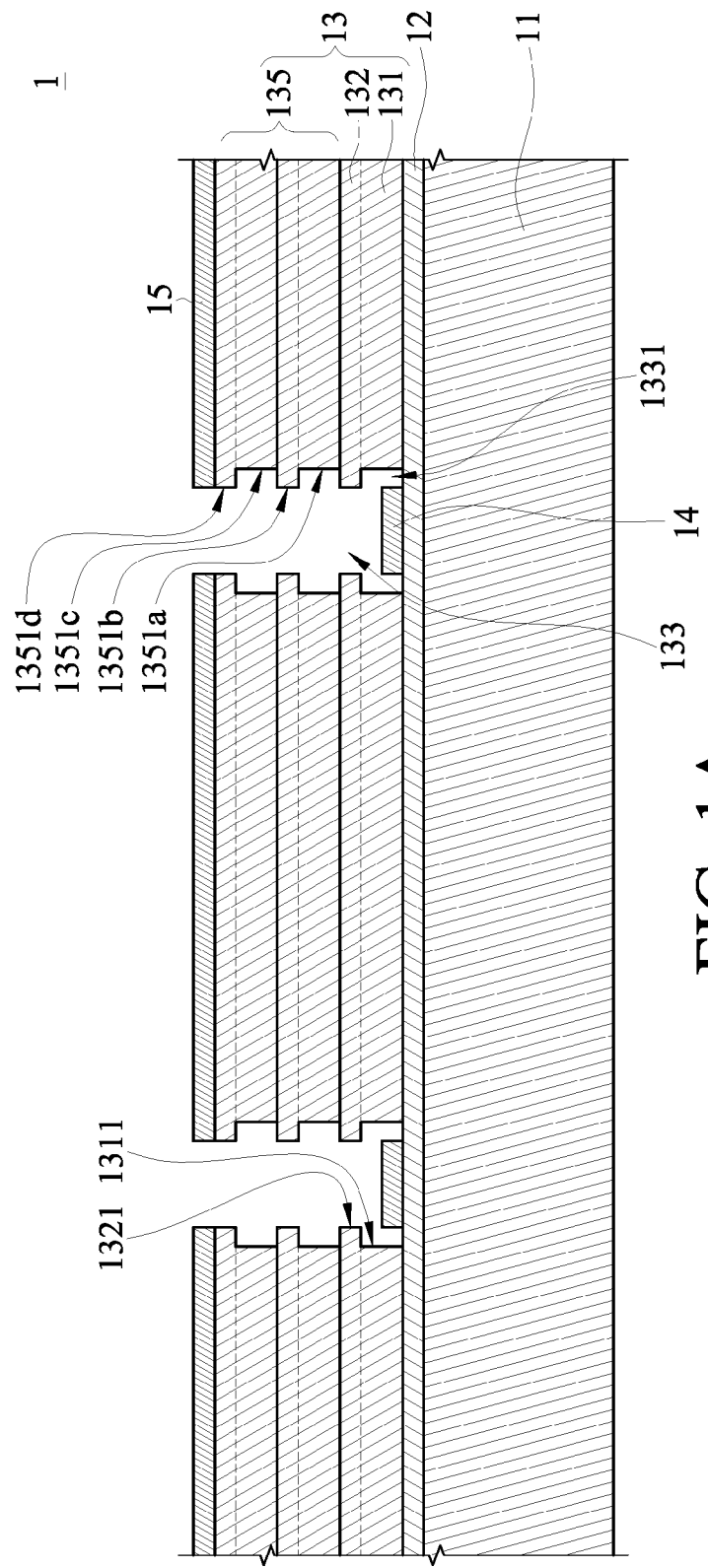
FIG. 1A is a schematic structure diagram of a LED load board in an embodiment.

Please refer to FIG. 1A. FIG. 1A is a schematic structure diagram of a LED load board in an embodiment. A LED load board 1 includes a substrate 11, a first dielectric layer 12, a second dielectric layer 13, a first conductive pad 14 and a second conductive pad 15. The second dielectric layer 13 includes a first structure portion 131, a second structure portion 132 and a third structure portion 135. The first structure portion 131 includes a first sidewall 1311, the second structure portion 132 includes a second sidewall 1321, and the third structure portion 135 is constructed by multiple layers and thus, includes multiple third sidewalls, such as third sidewalls 1351a~1351d. In practice, the third structure portion 135 has no limitation on the number of sidewalls. The first sidewall 1311, the second sidewall 1321 and the third sidewalls 1351a~1351d constitute a first etched portion 133.

The first dielectric layer 12 is on the substrate 11. The first structure portion 131 of the second dielectric layer 13 is on the first dielectric layer 12, and the second structure portion 132 of the second dielectric layer 13 is on the first structure portion 131. The first conductive pad 14 is at the bottom of the first etched portion 133. The second conductive pad 15 is on the third structure portion 135, covers a fraction of the second dielectric layer 13, and exposes the openings of the first etched portion 133.

Instances of the material of the substrate 11 include silicon. Instances of the first dielectric layer 12 include a film which is formed on the surface of the substrate 11 by heating the surface of the substrate 11 in the heating process.

The materials of the first structure portion 131 and the second structure portion 132 of the second dielectric layer 13 are the same in an embodiment or are different in another embodiment. That is, the second dielectric layer 13 is formed integrally or formed by piling multiple layers. Moreover, the second sidewall 1321 of the second structure portion 132 is more prominent than the first sidewall 1311 of the first structure portion 131, so the first etched portion 133 constituted by the first sidewall 1311 and the second sidewall 1321 has an undercut structure. Specifically, the second structure portion 132 and the first dielectric layer 12 have a gap portion 1331 therebetween, and the gap portion 1331 is a fraction of the first etched portion 133. The second structure portion 132 is separated from a fraction of the first dielectric layer 12 by the gap portion 1331 and faces the fraction of the first dielectric layer 12. The width of the gap portion 1331 is substantially equal to the thickness of the first structure portion 131.

In an embodiment, the first structure portion 131, the second structure portion 132 and the third structure portion 135 are oxide materials. In another embodiment, the first structure portion 131 and the odd layers of the third structure portion 135 are made of, for example, but not limited to, polysilicon, and the second structure portion 132 and the even layers of the third structure portion 135 are made of, for example, but not limited to, oxide or dielectric materials. In this embodiment, the thermal conductivity and etching rate of the first structure portion 131 are higher than those of the second structure portion 132, and the thermal conductivity and etching rate of odd layers of the third structure portion 135 are higher than those of even layers of the third structure portion 135.

The material of the first conductive pad 14 is the same as that of the second conductive pad 15. In this embodiment, the first conductive pad 14 and the second conductive pad 15 are made of, for example, but not limited to, sliver. More particularly, the first conductive pad 14 and the second conductive pad 15 are formed by, for example, but not limited to, coating sliver on the LED load board 1 in a sputtering process or evaporation deposition process. Because of the structure relief of the LED load board 1 as well as the undercut structure, a fraction of the sliver film will constitute the first conductive pad 14 on the first dielectric layer 12 as another fraction of the sliver film will constitute the second conductive pad 15 on the third structure portion 135. Moreover, the first conductive pad 14 does not contact the second conductive pad 15, and the first conductive pad 14 does not contact the first structure portion 131.

Figure 1B:
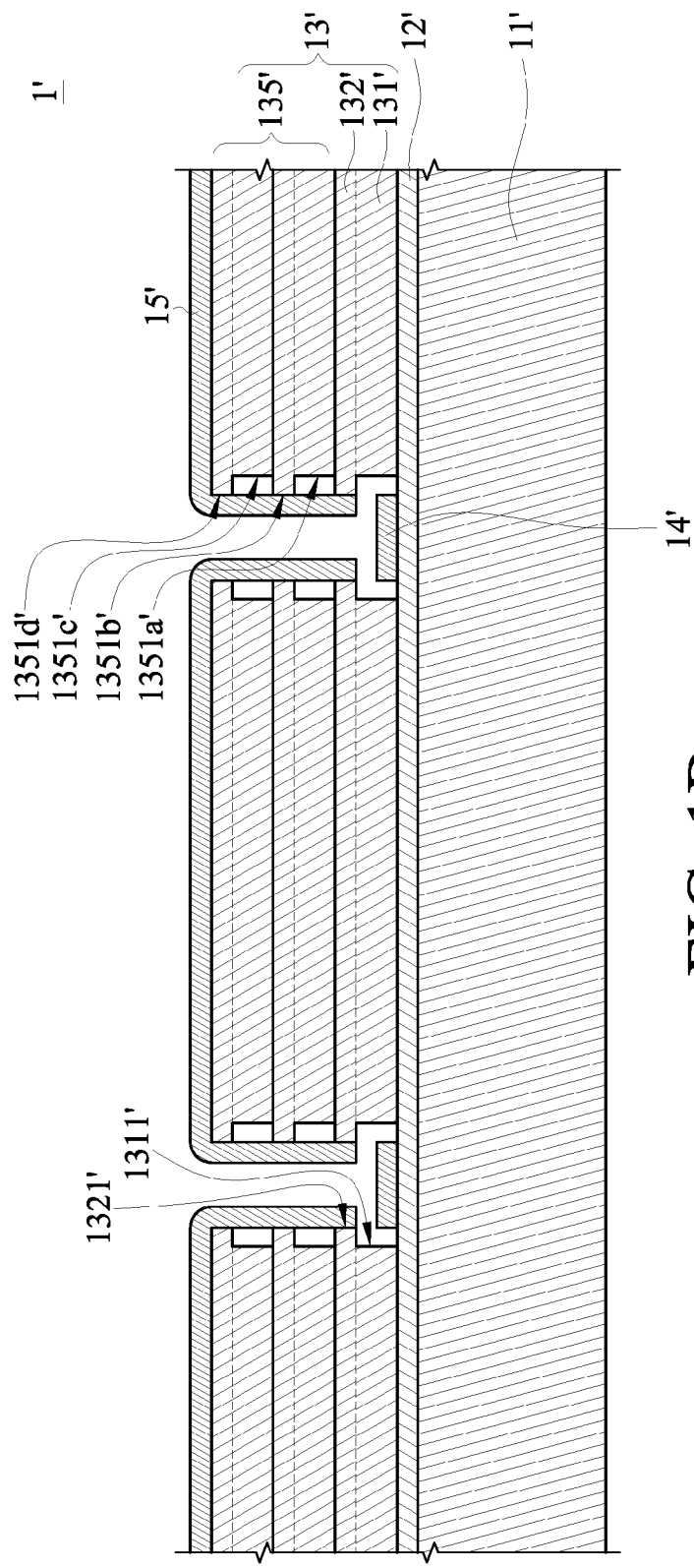
FIG. 1B is a schematic structure diagram of the LED load board in FIG. 1A in another embodiment.

Please refer to FIG. 1B to describe another embodiment of the second conductive pad 15. FIG. 1B is a schematic structure diagram of the LED load board in FIG. 1A in another embodiment. Different from the structure in FIG. 1A, a second conductive pad 15' in FIG. 1B sticks out from a third sidewall 1351d' of a third structure portion 135', and the second conductive pad 15' extends toward a substrate 11' and covers third sidewalls 1351a'~1351d' and at least part of a second sidewall 1321'. In this embodiment, the second conductive pad 15' does not contact a first conductive pad 14'. The structure of the LED load board 1' is exemplary and will not be restricted to that the second conductive pad 15' covers all the third sidewalls 1351a'~1351d', on condition that the second conductive pad 15' does not contact the first conductive pad 14'.

Figure 1C:
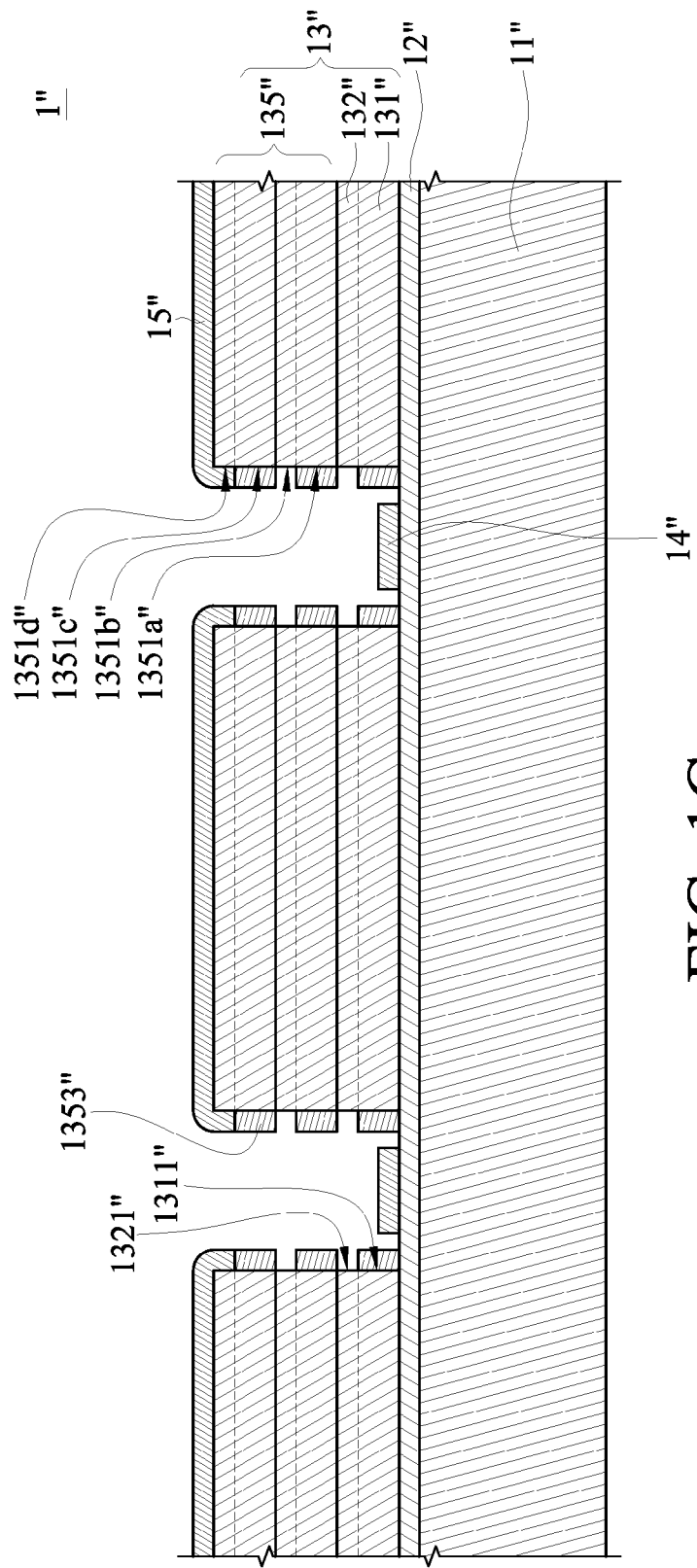
FIG. 1C is a schematic structure diagram of the LED load board in FIG. 1A in yet another embodiment.

Please refer to FIG. 1C. FIG. 1C is a schematic structure diagram of the LED load board in FIG. 1A in yet another embodiment. The material of a second structure portion 132" is mainly made of polysilicon, and the material of the second structure portion 132" is different from the material of a first structure portion 131". A protruding part of a second sidewall 1321" and the periphery thereof are subject to a high-temperature oxidization to constitute a polysilicon oxide insulation layer 1353". In other words, the polysilicon oxide insulation layer 1353" externally covers a primary polysilicon material, so the conductivity between a first conductive pad 14" and a second conductive pad 15" decreases.

Figure 2:
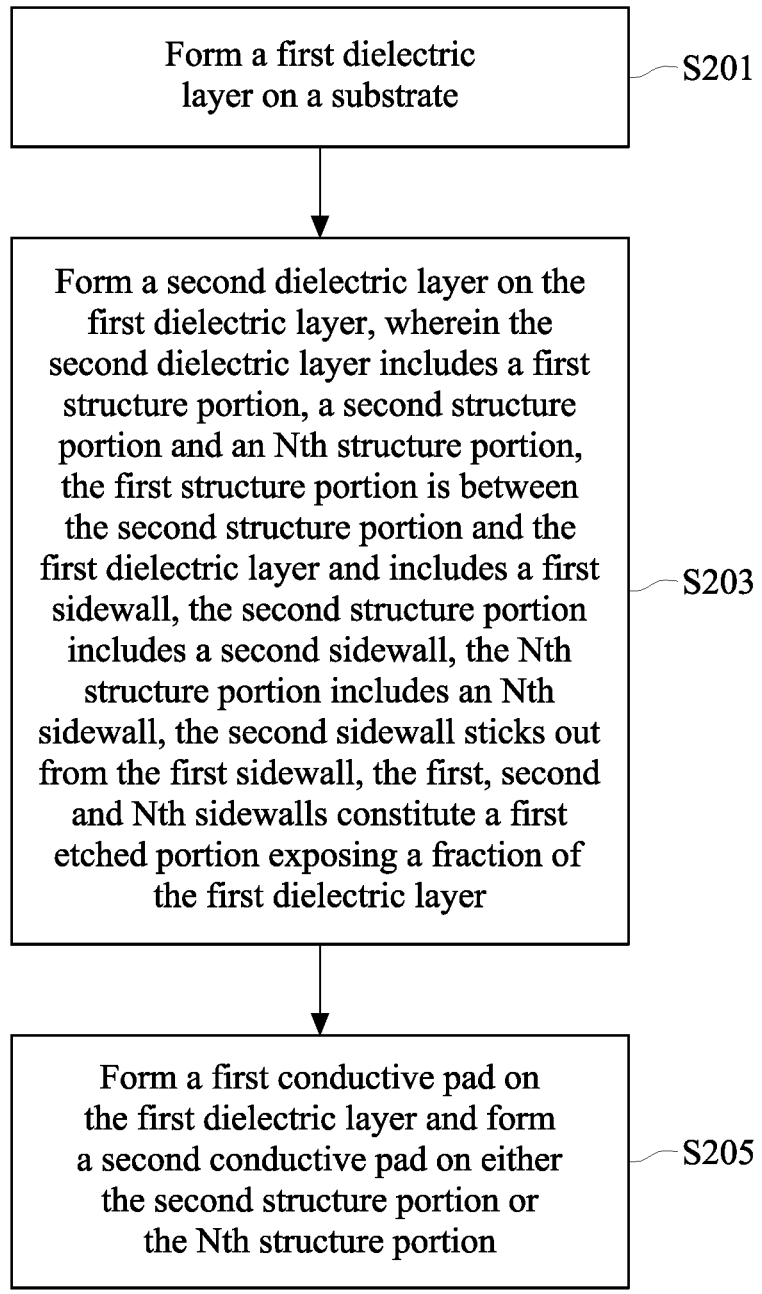
FIG. 2 is a flow chart of a manufacturing method of the LED load board in an embodiment.

In view of the structure of the LED load board 1, the disclosure also provides a manufacturing method of LED load boards. Please refer to FIGS. 1A~1C and FIG. 2 to illustrate the manufacturing method. FIG. 2 is a flow chart of a manufacturing method of the LED load board in an embodiment. The manufacturing method includes the following steps. First, in step S201, form the first dielectric layer 12 on the substrate 11. Then, in step S203, form the second dielectric layer 13 on the first dielectric layer 12. The second dielectric layer 13 includes the first structure portion 131, the second structure portion 132 and the third structure portion 135. Next, in step S205, form the first conductive pad 14 on the first dielectric layer 12 and form the second conductive pad 15 on the second structure portion 132. The detailed structure of the LED load board 1 can be referred to the foregoing description and thus, will not be repeated hereinafter. In view of the LED load board 1" in FIG. 1C, the protruding part of the first sidewall is further subject to a high-temperature heating process to form the aforementioned oxide insulation layer in step S203.

In step S203, an integral second dielectric layer is formed by the following manufacturing process, and the second dielectric layer has an undercut structure. Please refer to FIG. 3A~FIG. 3E. FIG. 3A~FIG. 3F are schematic diagrams illustrating a process of manufacturing the LED load board 1 in FIG. 1A in an embodiment.

Figure 3A:
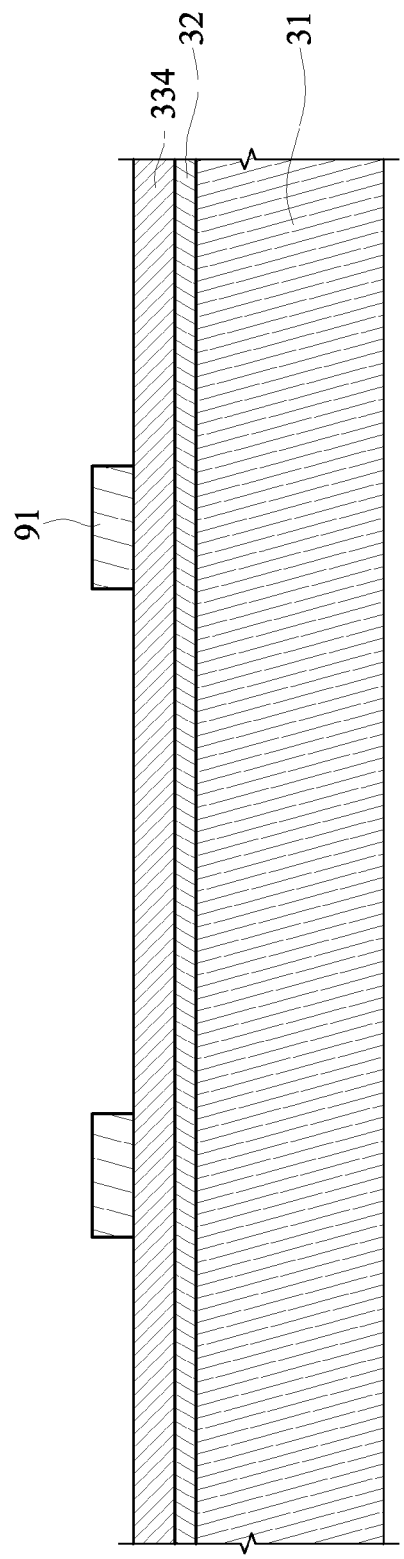
FIG. 3A~FIG. 3F are schematic diagrams illustrating a process of manufacturing the LED load board in FIG. 1A in an embodiment.

In the step shown in FIG. 3A, a first dielectric layer 32 is formed on a substrate 31, and a deposition layer 334 is formed on the first dielectric layer 32. Then, a first photoresist layer 91 is formed on the deposition layer 334, and the first photoresist layer 91 has a first pattern. The substrate 31 is, for example, but not limited to, a silicon substrate. The first dielectric layer 32 is, for example, but not limited to, a film formed on the surface of the silicon substrate by heating the surface of the silicon substrate. The deposition layer 334 is, for example, but not limited to, boro-phospho-silicate glass (BPSG) formed by depositing a molecule material on the first dielectric layer 32. The first photoresist layer 91 is, for example, but not limited to, a positive photoresist layer, and in another embodiment, the first photoresist layer 91 is a negative photoresist layer and has a relevant pattern.

Figure 3B:
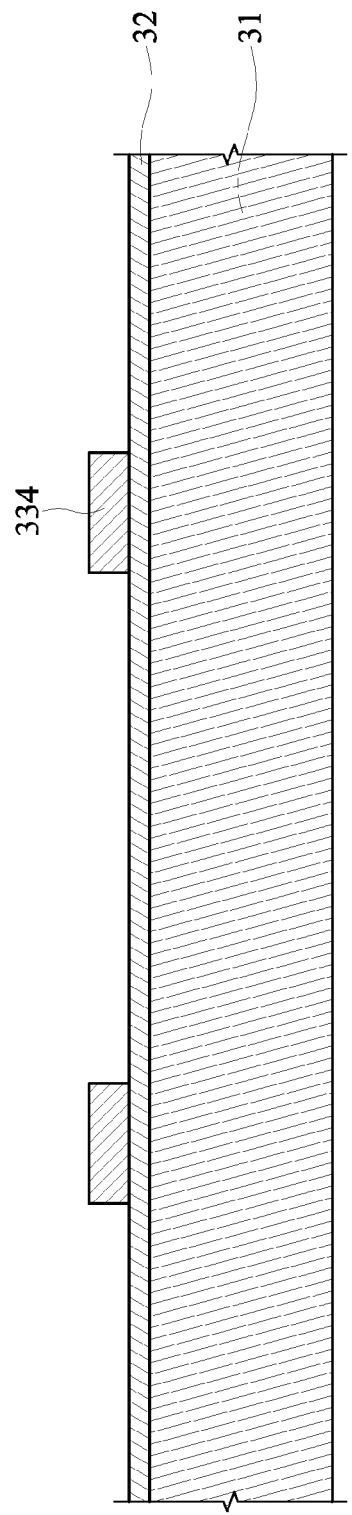

In the step shown in FIG. 3B, the transition structure formed in the step shown in FIG. 3A is subject to a photolithography process to remove a fraction of the deposition layer 334. After that, remove the first photoresist layer 91 to let the rest of the deposition layer 334 be exposed.

Figure 3C:
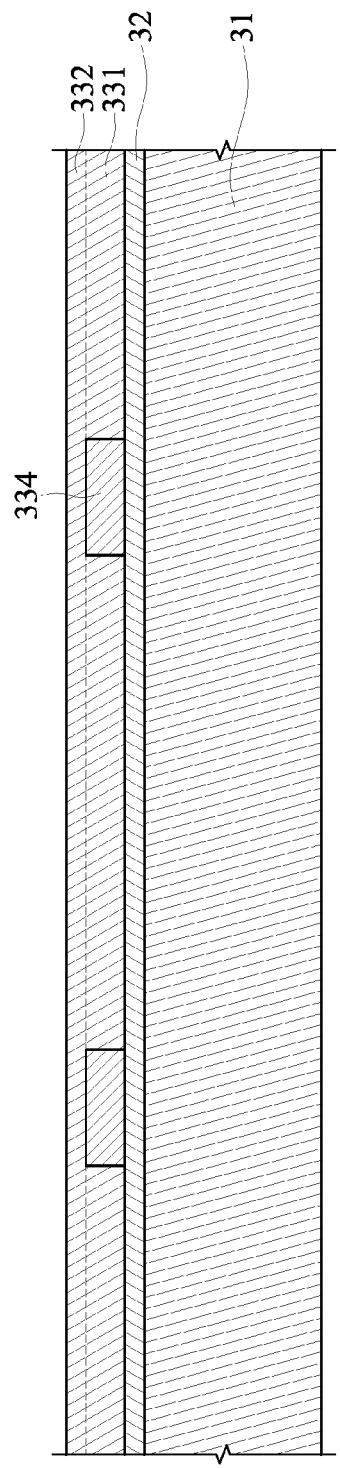

In the step shown in FIG. 3C, a first structure portion 331 and a second structure portion 332 are formed on the transition structure produced in the step with respect to FIG. 3B. The deposition layer 334 and the first dielectric layer 32 are covered with the first structure portion 331 and the second structure portion 332, and the first structure portion 331 and the second structure portion 332 fill the one or more spaces (referred to as accommodation space) in the deposition layer 334.

Subsequently, in the step shown in FIG. 3D, the transition structure of a third structure portion 335 is formed again on the second structure portion 332 by the methods with respect to FIGS. 3B and 3C. The details of the transition structure of the third structure portion 335 can be referred to the aforementioned description and thus, will not be repeated hereinafter. Herein, a second dielectric layer 33 is being shaped on the first dielectric layer 32. Then, a second photoresist layer 92 is formed on this second dielectric layer 33, and the second photoresist layer 92 has a second pattern. In this embodiment, the second dielectric layer 33 is made of, for example, but not limited to an oxide material, and the second photoresist layer 92 is, for example, but not limited to a positive photoresist layer.

Figure 3D:
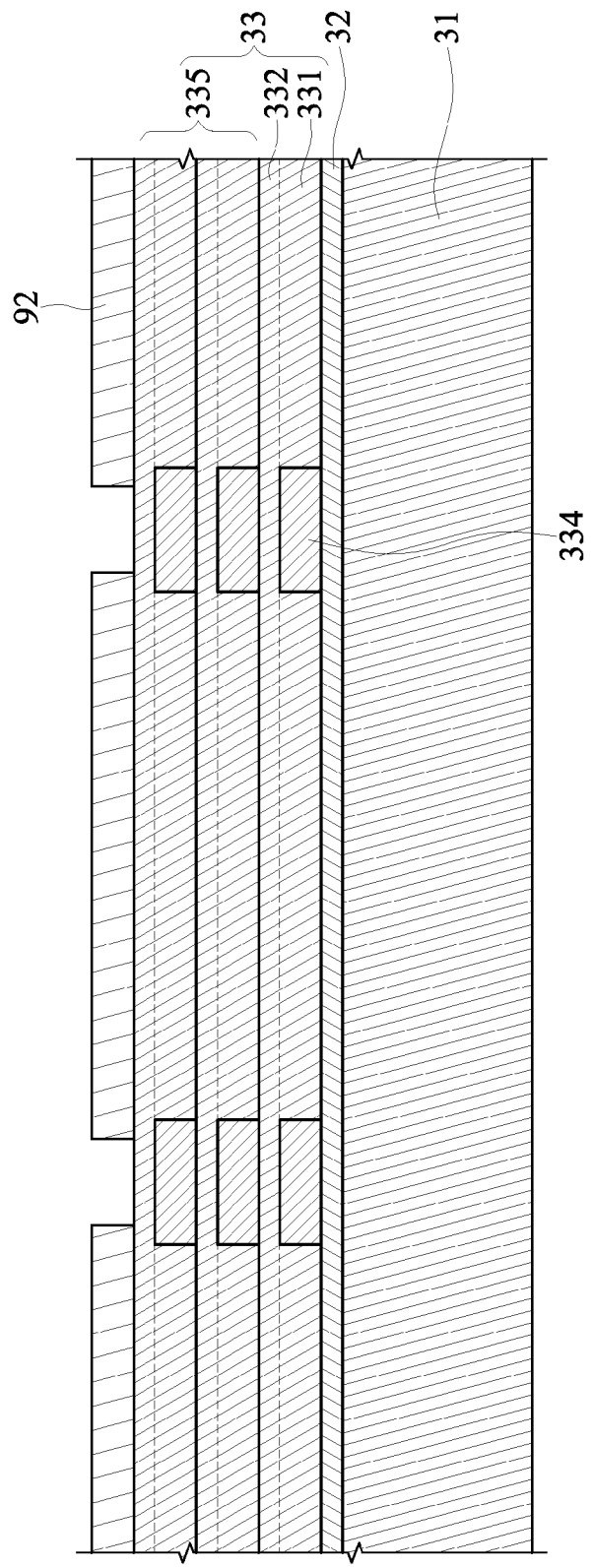
Figure 3E:
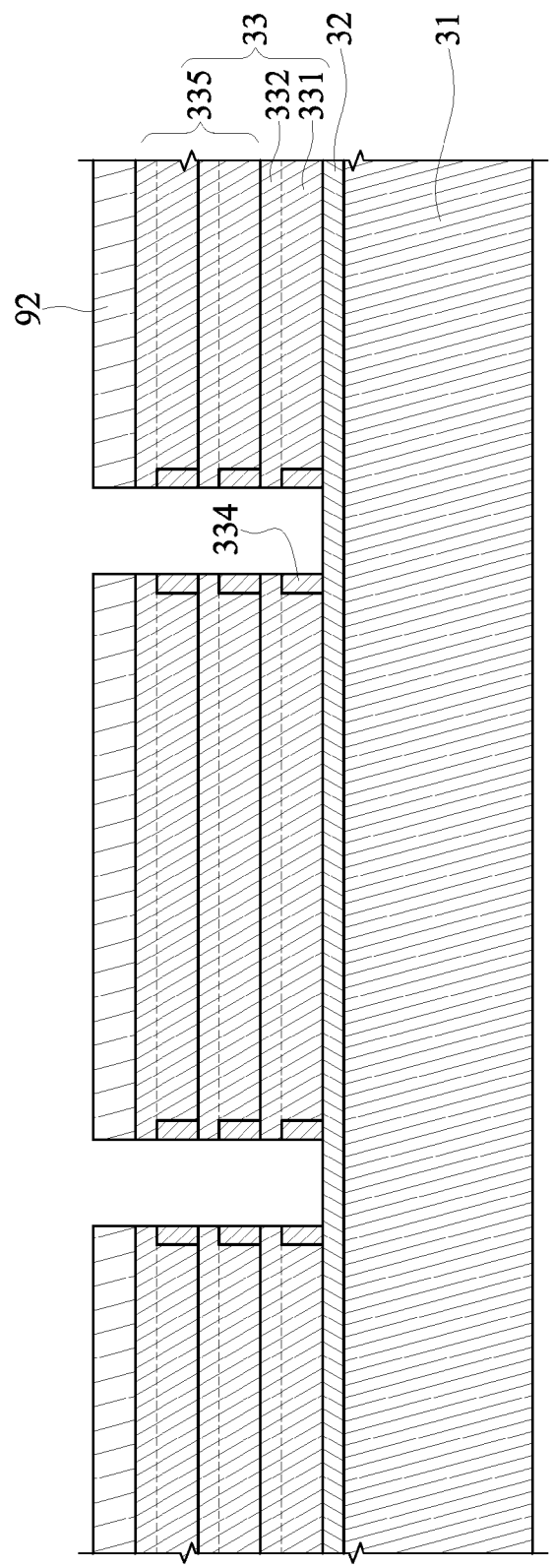

In the step shown in FIG. 3E, the transition structure produced in the step with respect to FIG. 3D is subject to another photolithography process to remove a fraction of the second dielectric layer 33 and a fraction of the reset of the deposition layer 334. After that, the second photoresist layer 92 is removed. Herein, the second dielectric layer 33 substantially becomes a structure constituted by stacking multiple T-shaped layers, and the rest of the deposition layer 334 is in the spaces between the head parts of these T-shaped layers and is also in the spaces between the T-shaped layer and the first dielectric layer 32.

Figure 3F:
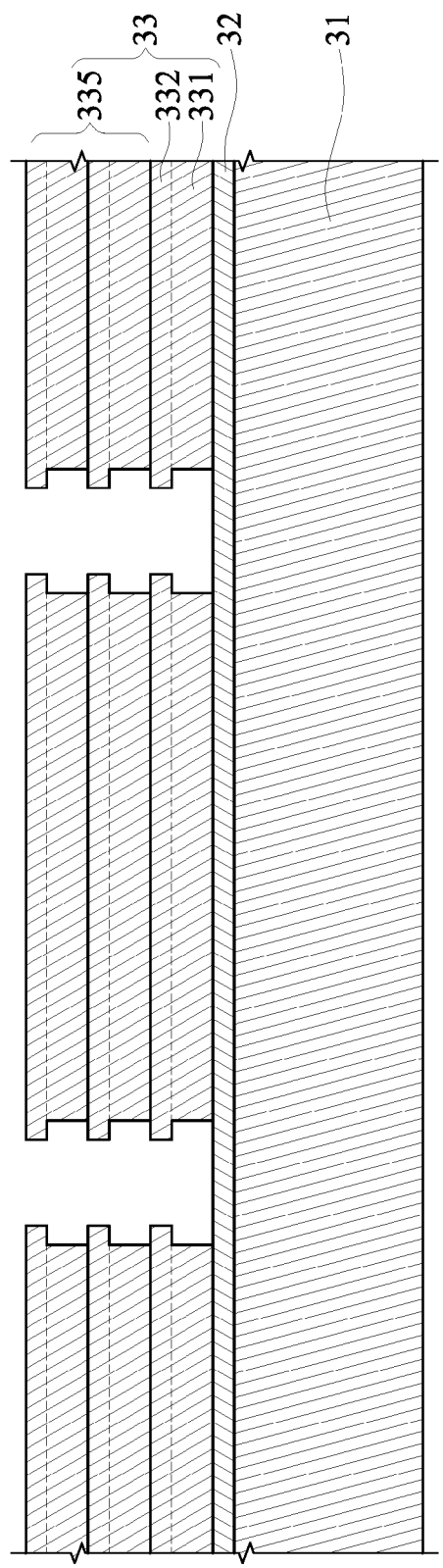

In the step shown in FIG. 3F, the rest of the deposition layer 334 is removed, so the second dielectric layer 33 herein has an undercut structure as described above.

On the other hand, in addition to carrying out the production of the second dielectric layer by the manufacturing process with respect to FIGS. 3A~3F, the second dielectric layer, which has a multi-player structure and an undercut structure, in step S203 can be produced by the following manufacturing process with respect to FIG. 4A~FIG. 4E. FIG. 4A~FIG. 4E are schematic diagrams illustrating a process of manufacturing the LED load board in FIG. 1A in another embodiment.

Figure 4A:
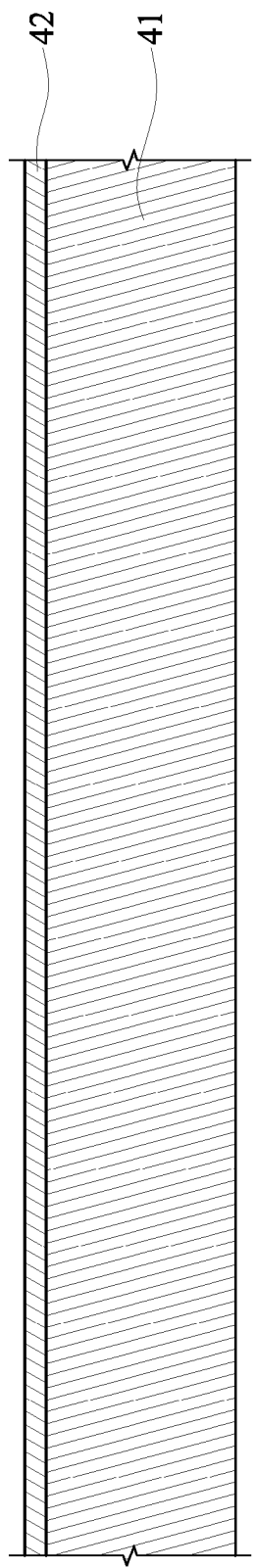
FIG. 4A~FIG. 4E are schematic diagrams illustrating a process of manufacturing the LED load board in FIG. 1A in another embodiment.
Figure 4B:
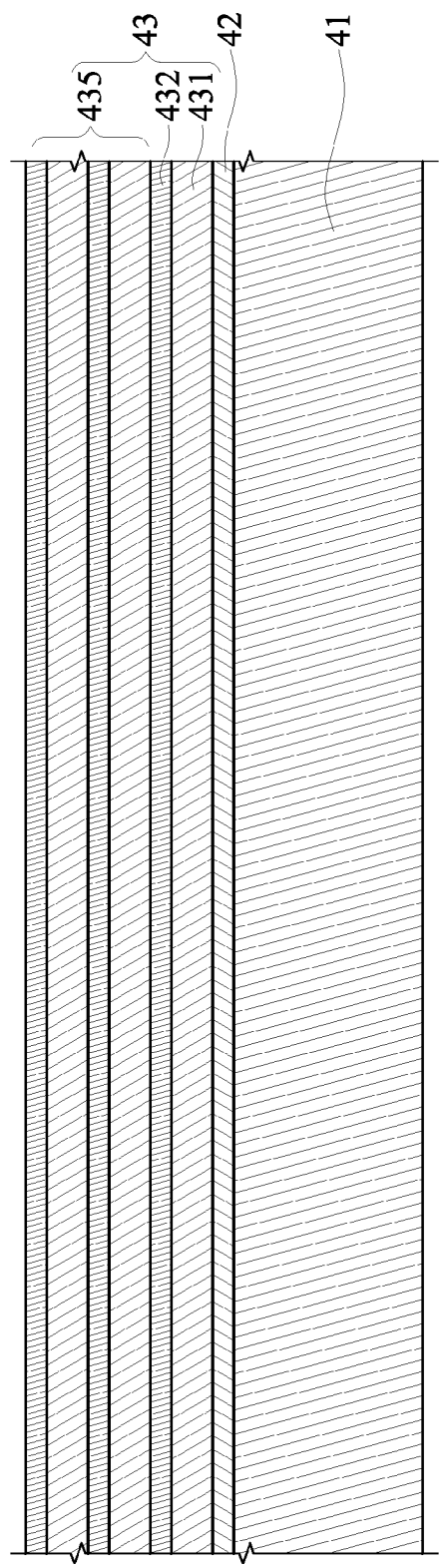

In the step shown in FIG. 4A, a first dielectric layer 42 is formed on a substrate 41. In the step shown in FIG. 4B, a first structure portion 431 is formed on the first dielectric layer 42, then after a second structure portion 432 is formed on the first structure portion 431, a third structure portion 435 is formed on the second structure portion 432. Herein, a second dielectric layer 43 is formed in rough. In this embodiment, the first structure portion 431 and odd layers of the third structure portion 435 are made of, for example, but not limited to, polysilicon, and the second structure portion 432 and the first structure portion 431 are made of different materials. Also, the material of odd layers of the third structure portion 435 is different from the material of even layers of the third structure portion 435. Therefore, the etching rate for the first structure portion 431 is different from the etching rate for the second structure portion 432, and the etching rate for the odd layers of the third structure portion 435 is different from the etching rate of the even layers of the third structure portion 435. In this embodiment, the etching rate for the first structure portion 431 is higher than the etching rate for the second structure portion 432, and the etching rate for the odd layers of the third structure portion 435 is higher than the etching rate for the even layers of the third structure portion 435.

Figure 4C:
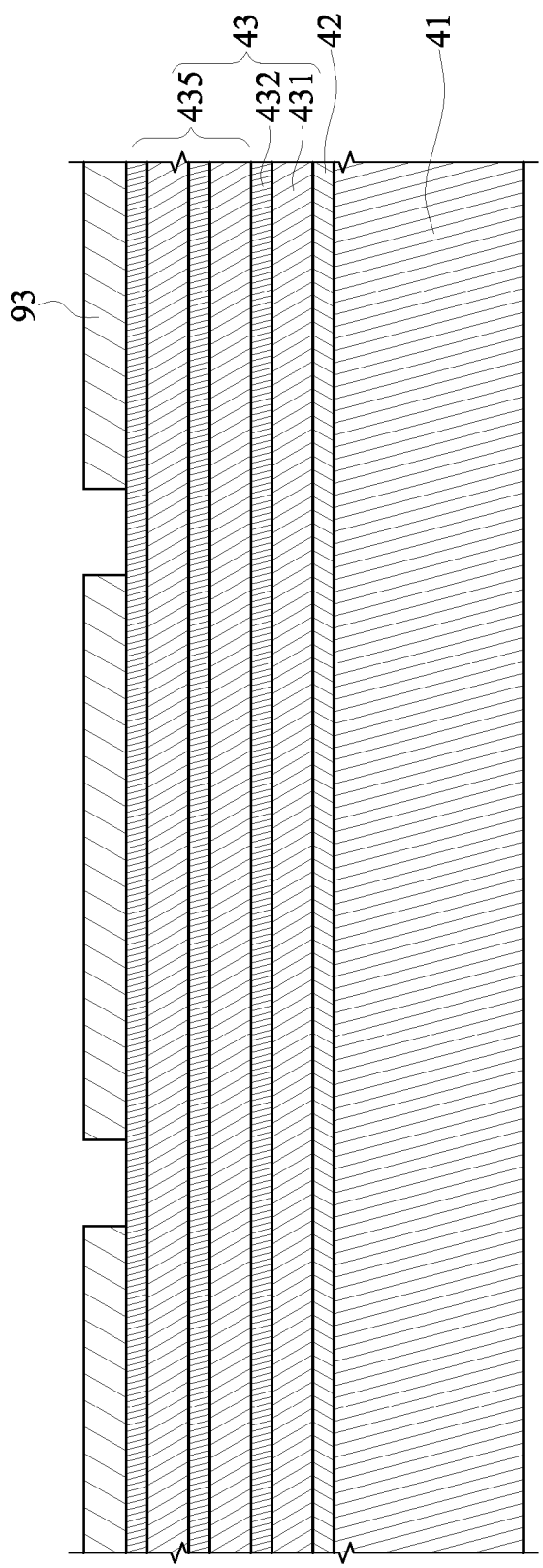
Figure 4D:
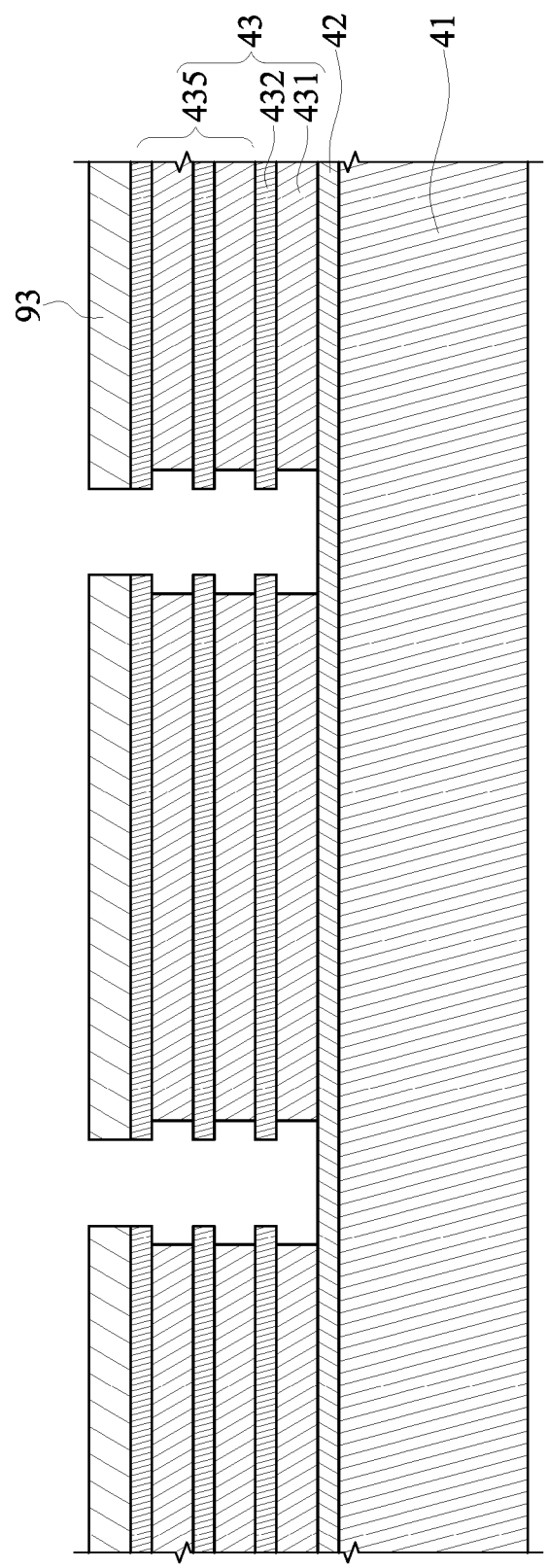
Figure 4E:
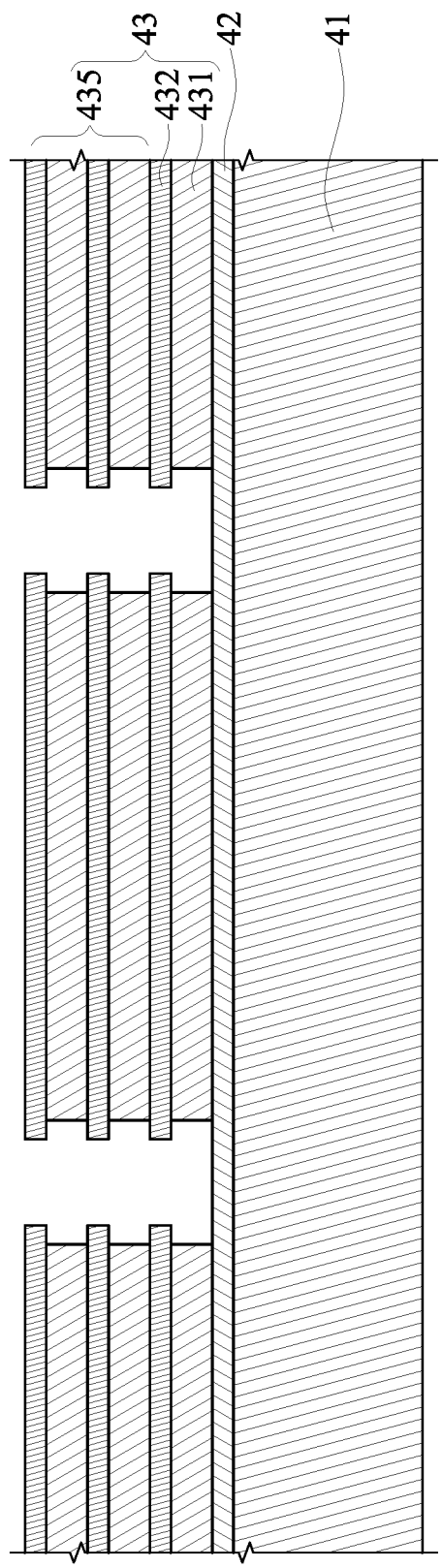

Then, in the step shown in FIG. 4C, a third photoresist layer 93 is formed on the third structure portion 435, and the third photoresist layer 93 has a third pattern. In the step shown in FIG. 4D, the transition structure produced in the step with respect to FIG. 4C is subject to a wet etching process to remove a fraction of the first structure portion 431, a fraction of the second structure portion 432, and a fraction of the third structure portion 435. Since the etching rate for the first structure portion 431 is relatively high, the removed part of the first structure portion 431 is more than that of the second structure portion 432, thereby forming an undercut structure. Moreover, the odd layers of the third structure portion 435 has a relatively high etching rate as compared to the even layers of the third structure portion 435, so the sidewalls of the even layers of the third structure portion 435 are more prominent than the sidewalls of the odd layers of the third structure portion 435. Subsequently, the third photoresist layer 93 is removed in the step shown in FIG. 4E.

Note that the embodiments with respect to FIG. 3A~FIG. 4E employ rectangles to represent the construction layers of the load board for the concise description of the disclosure. A person skilled in the art should understand that the disclosure has no limitation in the aspect ratio or angles of the rectangle.

Hereinafter, the structure and applications of the LED load board in the disclosure will be described in more detail, where in view of the foregoing description, the first and second structure portions of the second dielectric layer are integrated or are formed by piling multiple layers using a polysilicon material and thus, will not be repeated.

Figure 5A:
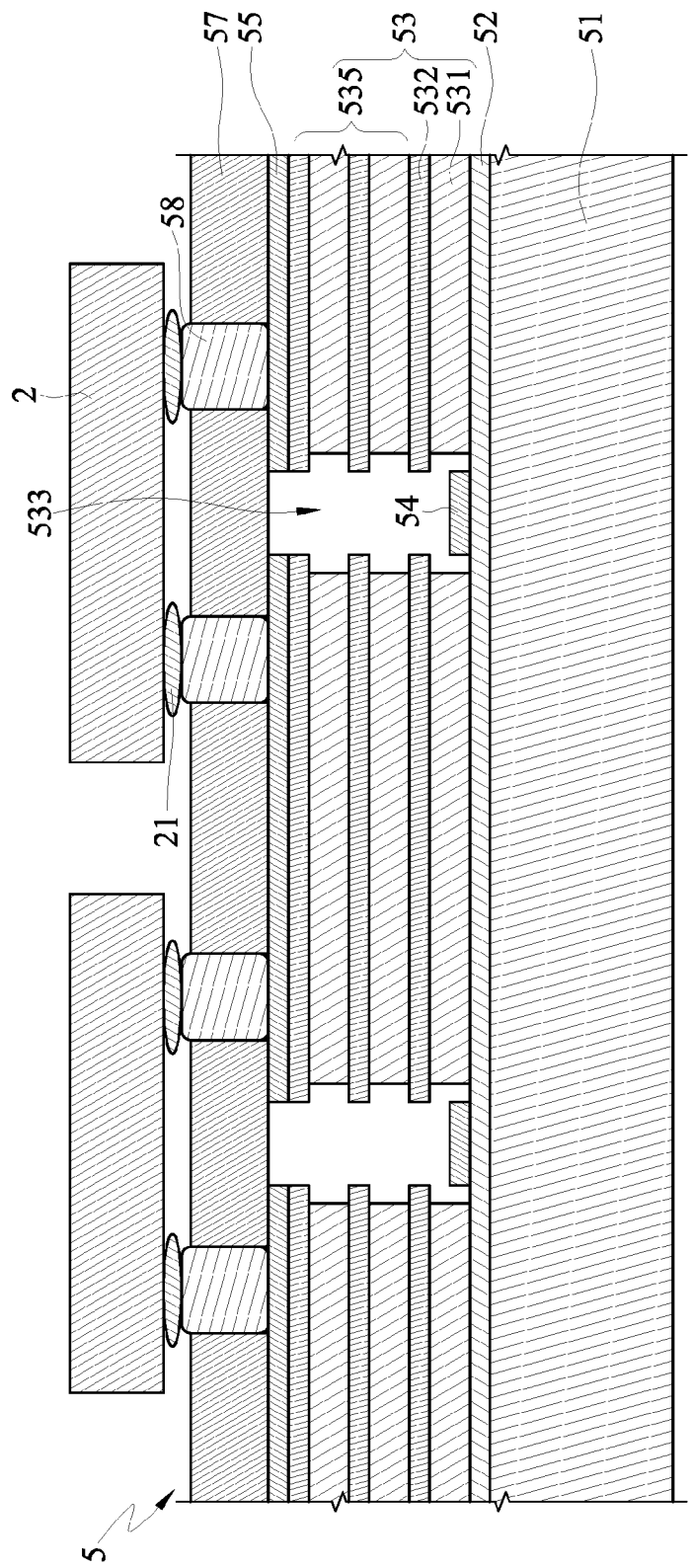
FIG. 5A is a schematic structure diagram of a LED load board in another embodiment.

Please refer to FIG. 5A. FIG. 5A is a schematic structure diagram of a LED load board in another embodiment. As compared to the embodiment in FIG. 1A, a LED load board 5 in FIG. 5A further includes an insulation layer 57 and conductive pillars 58. The insulation layer 57 covers openings of a first etched portion 533 and exposes a fraction of a second conductive pad 55. In another embodiment, the insulation layer 57 further fills the spaces in the first etched portion 533. The conductive pillar 58 is on the second conductive pad 55, one terminal of the conductive pillar 58 contacts the second conductive pad 55, and another terminal of the conductive pillar 58 sticks out from the insulation layer 57.

In FIG. 5A, a LED component 2 is further disposed. The LED component 2 has connecting points 21. The conductive pillars 58 of the LED load board 5 are connected to the connecting points 21 in pairs. In other words, when the LED component 2 is disposed on the LED load board 5, the two terminals of the conductive pillar 58 are electrically connected to the second conductive pad 55 and the connecting point 21, respectively. In the drawing, the two connecting points 21 of the LED component 2 are electrically connected to the two second conductive pads 55, respectively, and the two second conductive pads 55 are not connected. In an embodiment, the two separated second conductive pads 55 in use are set at two different voltage potentials respectively, so the LED component 2 will sense the two different voltage potentials through the two connecting points 21 and will according to the difference between the two voltage potentials, decide whether to emit light. Moreover, the conductive pillars 58 are further aligned and connected with the LED component 2, so as to increase the assembling quality.

Figure 5B:
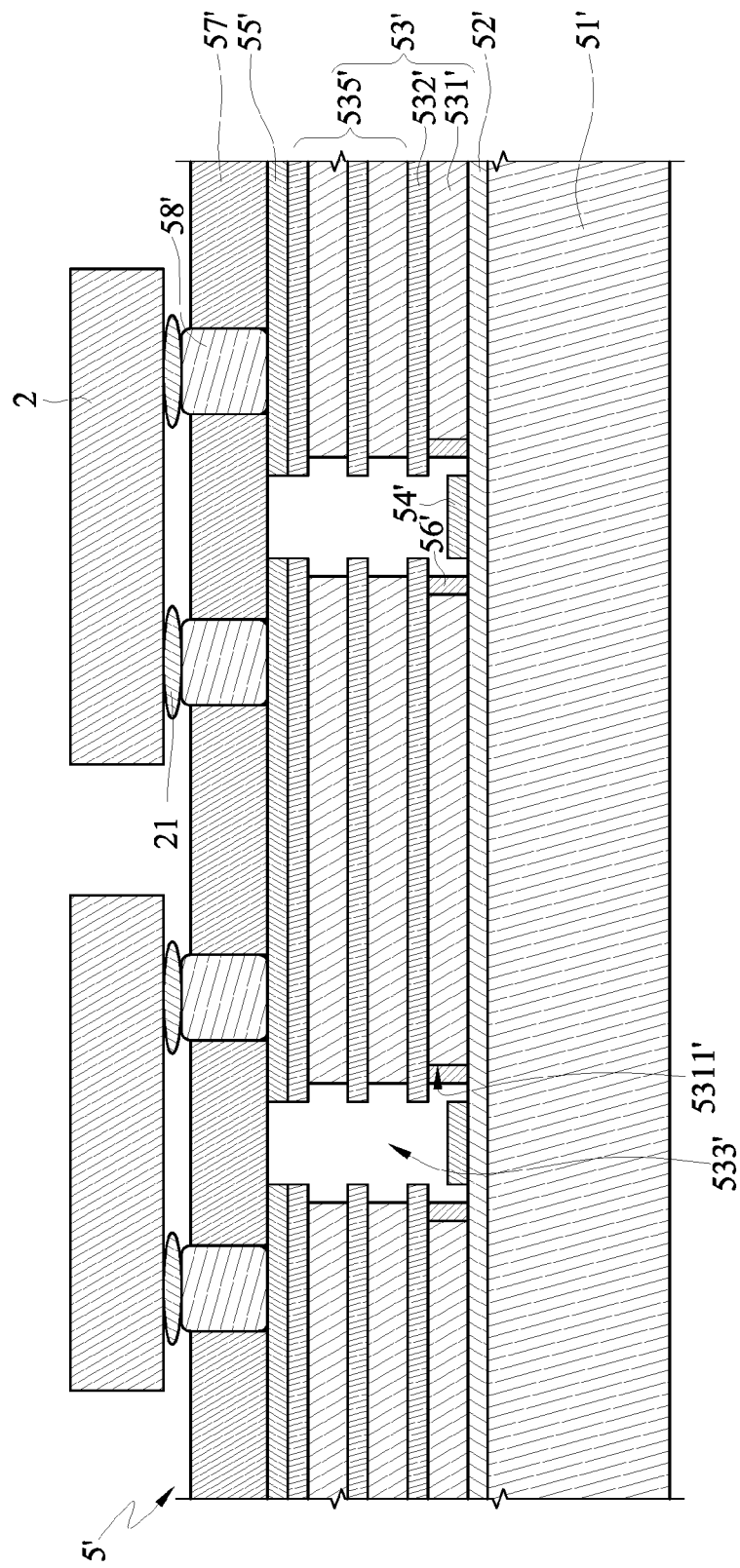
FIG. 5B is a schematic structure diagram of the LED load board in FIG. 5A in another embodiment.

Please refer to FIG. 5B. FIG. 5B is a schematic structure diagram of the LED load board in FIG. 5A in another embodiment. As compared to the embodiment with respect to FIG. 5A, a LED load board 5' in FIG. 5B further includes a third dielectric layer 56'. A first terminal of the third dielectric layer 56' contacts a first dielectric layer 52', a second terminal of the third dielectric layer 56' contacts a second structure portion 532', and a third terminal of the third dielectric layer 56' contacts a first sidewall 5311'. In the LED load board 5' in FIG. 5B, the third dielectric layer 56' is further disposed between a first conductive pad 54' and a first structure portion 531' to more efficiently prevent the first conductive pad 54' from contacting the first structure portion 531' because of the diffusion of first conductive pad 54', as compared to the previous embodiments in which air is used as an insulation medium separating the first conductive pad from the first structure portion. The third dielectric layer 56' is made of, for example, but not limited to, an oxide material.

Figure 5C:
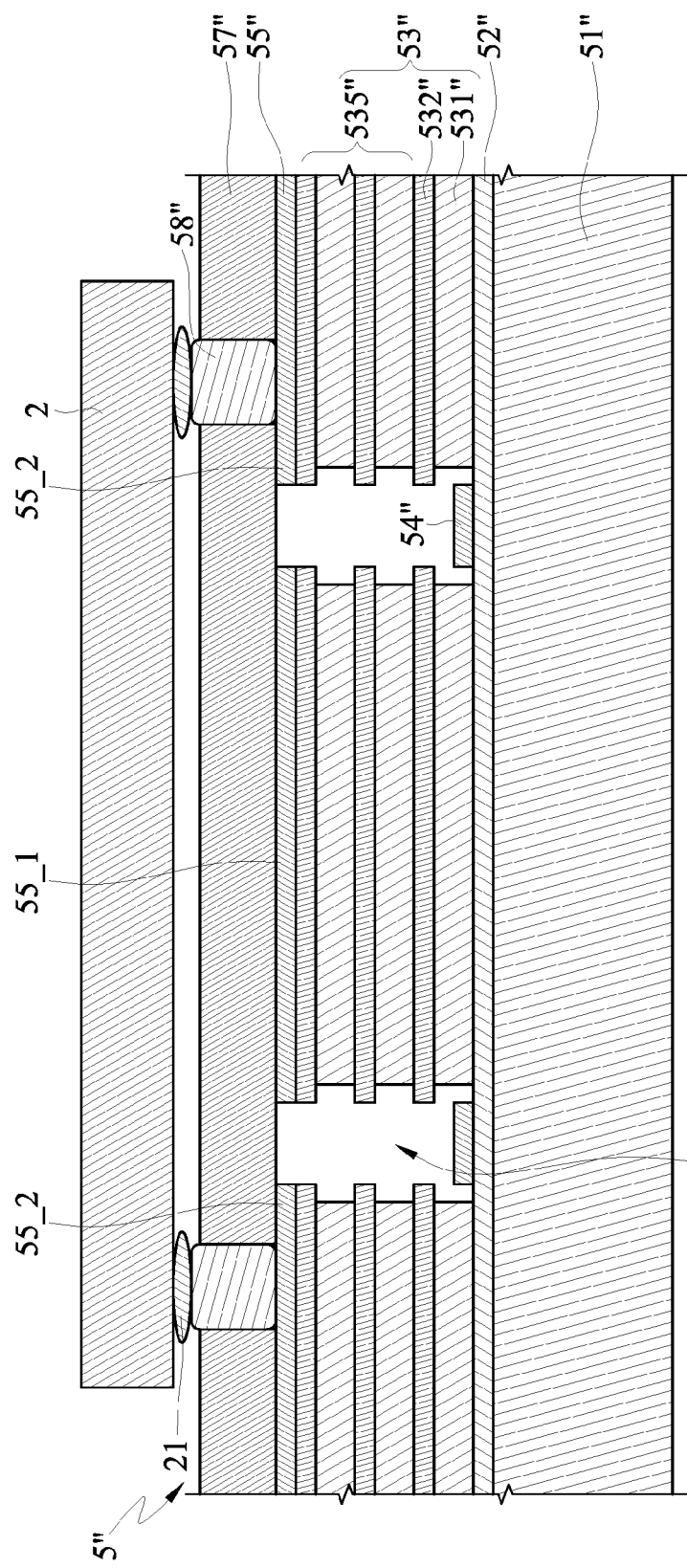
FIG. 5C is a schematic structure diagram of the LED load board in FIG. 5A in yet another embodiment.

Please refer to FIG. 5C. FIG. 5C is a schematic structure diagram of the LED load board in FIG. 5A in yet another embodiment. As compared to the embodiment with respect to FIG. 1A, a LED load board 5" in FIG. 5C further includes an insulation layer 57" and conductive pillars 58". The openings of the first etched portion 533" are covered by the insulation layer 57", and the insulation layer 57" exposes a fraction of a second conductive pad 55_2. In another embodiment, the insulation layer 57" further fills the spaces in the first etched portion 533". The conductive pillar 58" is formed on the second conductive pad 55_2. That is, when the second conductive pad 55_1 is used for strengthening the reflectivity merely. One terminal of the conductive pillar 58" contacts a fraction of the second conductive pad 55_2, which is insulated, and the other terminal of the conductive pillar 58" sticks out from the insulation layer 57".

Furthermore, a LED component 2 is disposed as shown in FIG. 5C. The LED component 2 includes connecting points 21. The conductive pillars 58" of the LED load board 5" are aligned and connected with the connecting points 21, respectively. That is, when the LED component 2 is disposed on the LED load board 5", the two terminals of the conductive pillar 58" are electrically connected to the second conductive pad 55_2 and the related connecting point 21, respectively. In the drawing, the two connecting points 21 of the LED component 2 are electrically connected to the two separated second conductive pads 55_2, respectively. In an embodiment, the two separated second conductive pads 55_2 are set at two different voltage potentials in use respectively; the LED component 2 will sense two different voltage potentials through the two connecting points 21, so as to emit light according to the difference between the two different voltage potentials. Since the conductive pillar 58" can be aligned and connected with the LED component 2, the assembling quality may be better.

Figure 6:
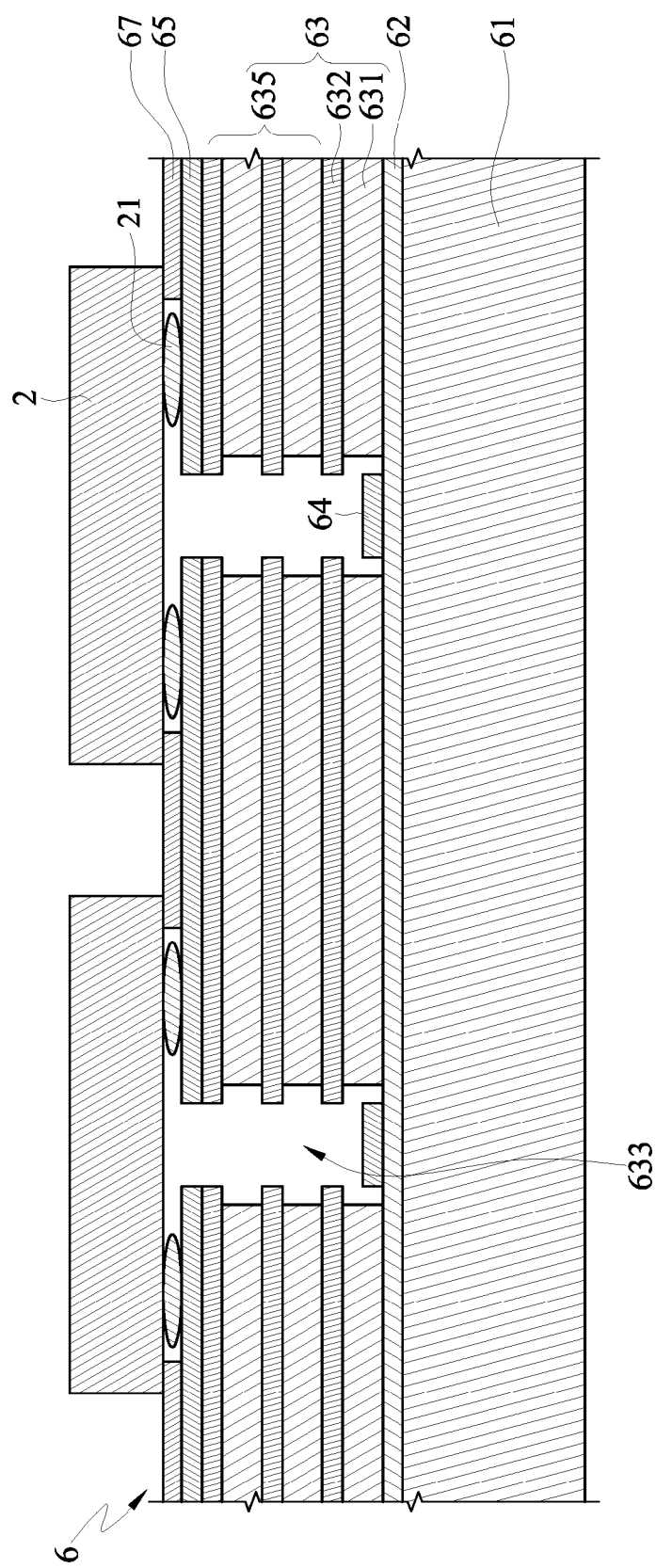
FIG. 6 is a schematic structure diagram of a LED load board in yet another embodiment.

Please refer to FIG. 6. FIG. 6 is a schematic structure diagram of a LED load board in yet another embodiment. In this embodiment, a second sidewall 6321 is more prominent than an edge of an insulation layer 67, so the insulation layer 67 exposes a fraction of a second conductive pad 65, which is around openings of a first etched portion 633. As shown in the drawing, a LED component 2 is disposed on the insulation layer 67, and the LED component 2 is electrically connected to the fraction of the second conductive pad 65, which is exposed by the insulation layer 67, through connecting points 21 directly. This is different from the previous embodiments, in which the LED component 2 is electrically connected to the second conductive pads through the conductive pillars indirectly.

Figure 7:
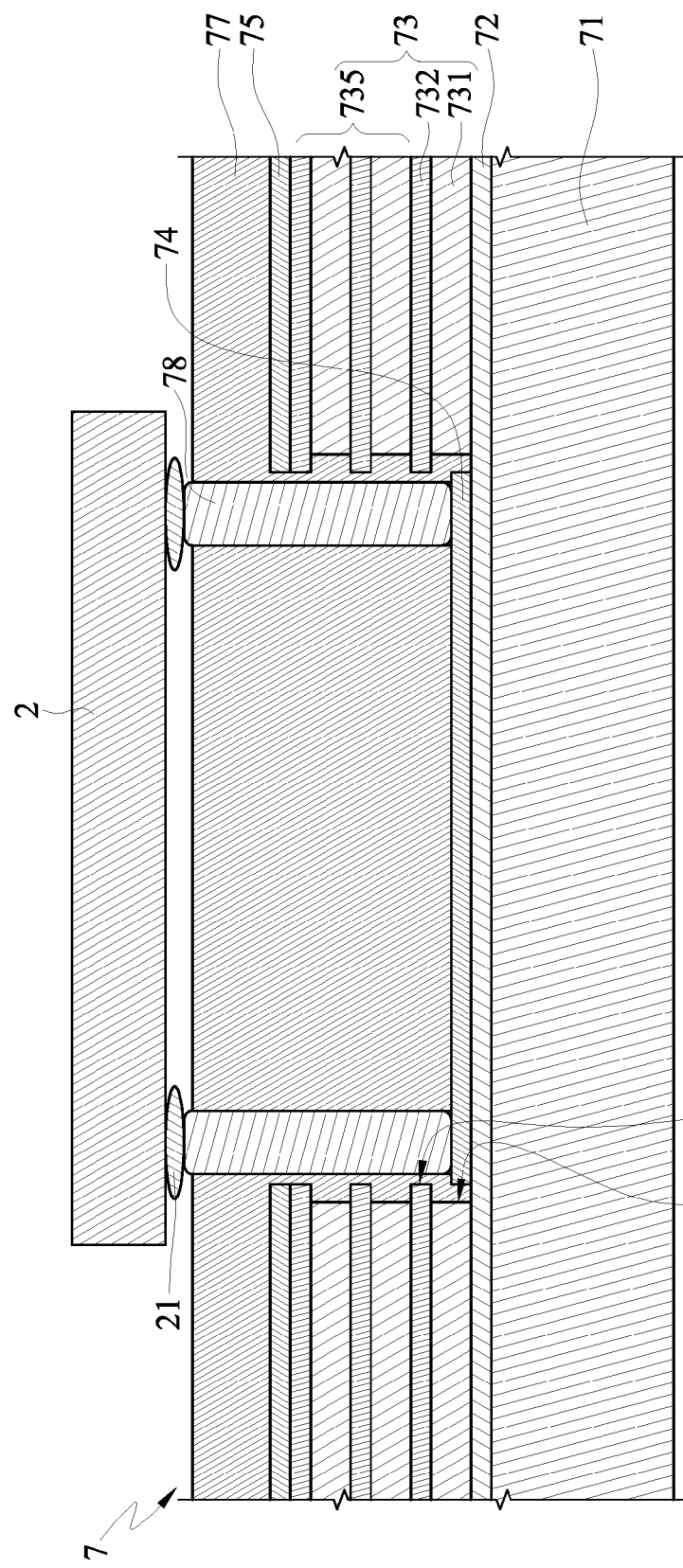
FIG. 7 is a schematic structure diagram of a LED load board in yet another embodiment.

Please refer to FIG. 7. FIG. 7 is a schematic structure diagram of a LED load board in yet another embodiment. In a LED load board 6 shown in FIG. 7, an insulation layer 77 covers a second conductive pad 75, a second sidewall 7321, a first sidewall 7311, and multiple sidewalls of a third structure portion 735. The insulation layer 77 exposes at least a fraction of a first conductive pad 74. Conductive pillars 78 are formed in the first conductive pad 74. One terminal of the conductive pillar 78 is electrically connected to the first conductive pad 74, and the other terminal of the conductive pillar 78 sticks out from the insulation layer 77. In other words, the conductive pillar 78 is separated from the second conductive pad 75 by the insulation layer 77 and is electrically connected to only the first conductive pad 74. Also, the conductive pillars 78 stick out from the insulation layer 77 and thus, can be aligned and connected with the connecting points 21 of the LED component 2.

As set forth above, the disclosure provides the above LED load board and the above manufacturing method thereof. The LED load board not only has an undercut structure, which is used to avoid the interconnection between different conductive layers, but also has multiple conductive pillars which are formed at the interface between the LED load board and the LEDs and are aligned and connected with the LEDs. Moreover, in the LED load board, one of the dielectric layers is made in part of polysilicon so that the thermal conductivity of the LED load board may increase. Therefore, the LED load board and the manufacturing method thereof in the disclosure may efficiently solve the problems caused by neglecting the aligning connection between the load board and LEDs in the art, and may enhance the thermal conductivity of the LED load board.

What is claimed is:

1. A light emitting diode (LED) load board, comprising:
   a substrate;
   a first dielectric layer formed on the substrate;
   a second dielectric layer comprising:
      a first structure portion formed on the first dielectric layer and comprising a first sidewall;
      a second structure portion formed on the first structure portion and comprising a second sidewall, which is more prominent than the first sidewall; and
      a third structure portion formed on the second structure portion and comprising N pieces of sidewall, wherein odd one of the N pieces of sidewall is more prominent than even one of the N pieces of sidewall, and the first and second sidewalls and the N pieces of sidewall constitute a first etched portion exposing a fraction of the first dielectric layer;
   a first conductive pad formed in the first etched portion; and
   a second conductive pad formed on the second dielectric layer, covering a fraction of the second dielectric layer, and exposing openings of the first etched portion.

2. The LED load board according to claim 1, wherein the second structure portion and the first dielectric layer have a gap portion therebetween, and a width of the gap portion is larger than a thickness of the first structure portion.

3. The LED load board according to claim 2, wherein an edge of the second conductive pad is coplanar with either the second sidewall or with the even one of the N pieces of sidewall.

4. The LED load board according to claim 2, wherein the second conductive pad covers either at least a fraction of the second sidewall or the even one of the N pieces of sidewall.

5. The LED load board according to claim 2, wherein the first conductive pad does not contact the first sidewall and the second sidewall or the even one of the N pieces of sidewall.

6. The LED load board according to claim 5, further comprising:
   an insulation layer covering the second conductive pad, the first sidewall, the second sidewall and the N pieces of sidewall and exposing a fraction of the first conductive pad; and
   N pieces of conductive pillar, at least one of which has one terminal electrically connected to the second conductive pad, and has another terminal sticking out from the insulation layer.

7. The LED load board according to claim 5, further comprising:
   an insulation layer filling an accommodation space in the first etched portion and exposing a fraction of the second conductive pad; and
   N pieces of conductive pillar, at least one of which has one terminal electrically connected to the second conductive pad, and has another terminal sticking out from the insulation layer.

8. The LED load board according to claim 5, further comprising:
   an insulation layer covering the second conductive pad, the first sidewall, the second sidewall and the N pieces of sidewall and exposing a fraction of the first conductive pad; and
   N pieces of conductive pillar, at least one of which has one terminal electrically connected to the first conductive pad, and has another terminal sticking out from the insulation layer.

9. The LED load board according to claim 2, wherein the first structure portion is made of polysilicon, and the first and second structure portions have a difference in material therebetween.

10. The LED load board according to claim 9, further comprising:
    an insulation layer, which is formed on the second conductive pad, covers a fraction of the second conductive pad, exposes a fraction of the second conductive pad, and covers openings of the first etched portion; and
    N pieces of conductive pillar, at least one of which has one terminal electrically connected to the second conductive pad, and has another terminal sticking out from the insulation layer.

11. The LED load board according to claim 10, further comprising:
    a third dielectric layer, which has a first terminal contacting the first dielectric layer, has a second terminal contacting the second structure portion, and has a third terminal contacting the first sidewall.

12. The LED load board according to claim 9, further comprising:
    an insulation layer which is formed on the second conductive pad and covers a fraction of the second conductive pad, and the second sidewall protruding a sidewall of the insulation layer.

13. The LED load board according to claim 2, wherein the first structure portion is made of polysilicon and is externally covered by a polysilicon oxide insulation layer, and the first structure portion and the second structure portion have a difference in material therebetween.

14. The LED load board according to claim 13, further comprising:
    an insulation layer, formed on the second conductive pad, covering a fraction of the second conductive pad, covering openings of the first etched portion, and exposing a fraction of the second conductive pad; and
    N pieces of conductive pillar, at least one of which has one terminal electrically connected to the second conductive pad, and has another terminal sticking out from the insulation layer.

15. A manufacturing method of light emitting diode load boards, comprising:
    forming a first dielectric layer on a substrate;
    forming on the first dielectric layer a second dielectric layer which comprises a first structure portion, a second structure portion and an Nth structure portion, the first structure portion being between the second structure portion and the first dielectric layer, the first structure portion comprising a first sidewall, the second structure portion comprising a second sidewall, the Nth structure portion comprising a Nth sidewall, the second sidewall sticking out from the first sidewall, the first, second sidewall and Nth sidewalls constituting a first etched portion exposing a fraction of the first dielectric layer; and forming a first conductive pad on the first dielectric layer and forming a second conductive pad on either the second structure portion or the Nth structure portion.

16. The manufacturing method according to claim 15, wherein forming the second dielectric layer on the first dielectric layer comprises:
   forming a deposition layer on the first dielectric layer;
   forming a first photoresist layer on the deposition layer, and the first photoresist layer comprising a first pattern;
   performing an etching process to remove a fraction of the deposition layer and remove the first photoresist layer;
   forming the second dielectric layer on the first dielectric layer and the deposition layer;
   forming a second photoresist layer on the second dielectric layer;
   performing another etching process to remove a fraction of the second dielectric layer and remove the deposition layer; and
   removing the rest of the deposition layer.

17. The manufacturing method according to claim 15, further comprising:
   forming an insulation layer on the second conductive pad, the insulation layer covering openings of the first etched portion and exposing a fraction of the second conductive pad; and
   forming on the second conductive pad N pieces of conductive pillar, at least one of which has one terminal electrically connected to the second conductive pad, and has another terminal sticking out from the insulation layer.

18. The manufacturing method according to claim 15, further comprising:
   forming on the second conductive pad an insulation layer which exposes a fraction of the second conductive pad, and the second sidewall protruding an edge of the insulation layer.

19. The manufacturing method according to claim 15, further comprising:
   forming a third dielectric layer, which has a first terminal contacting the first dielectric layer, a second terminal contacting the second structure portion, and a third terminal contacting the first sidewall;
   forming on the second conductive pad an insulation layer, which covers openings of the first etched portion and exposes a fraction of the second conductive pad; and
   forming N pieces of conductive pillar, at least one of which has one terminal electrically connected to the second conductive pad, and has another terminal sticking out from the insulation layer.

20. The manufacturing method according to claim 15, wherein forming the second dielectric layer on the first dielectric layer comprises:
   forming a polysilicon layer as the first structure portion on the first dielectric layer;
   forming the second structure portion on the first structure portion;
   forming a photoresist layer having a pattern on the second structure portion;
   producing the first etched portion by a wet etching process; and
   removing the photoresist layer.

21. The manufacturing method according to claim 20, further comprising:
   forming on the second conductive pad an insulation layer, which covers the second conductive pad, the first sidewall, the second sidewall and the Nth sidewall and exposes a fraction of the first conductive pad; and
   forming a conductive pillar, which has one terminal electrically connected to the first conductive pad, and has another terminal sticking out from the insulation layer.

22. The manufacturing method according to claim 20, further comprising:
   forming on the second conductive pad an insulation layer, which covers the second conductive pad, the first sidewall and the second sidewall and exposes a fraction of the first conductive pad; and
   forming a conductive pillar, which has one terminal electrically connected to the second conductive pad, and has another terminal sticking out from an insulation layer conductive pad.

23. A manufacturing method of light emitting diode load boards, comprising:
   forming a first dielectric layer on a substrate;
   forming on the first dielectric layer a second dielectric layer, which comprises a first structure portion, a second structure portion and a Nth structure portion; and
   forming a first conductive pad on the first dielectric layer and forming a second conductive pad on either the second structure portion or the Nth structure portion,
   wherein the first structure portion is between the second structure portion and the first dielectric layer; the first structure portion comprises a first sidewall; the second structure portion comprises a second sidewall; the Nth structure portion comprises a Nth sidewall; the second sidewall sticks out from the first sidewall, and the sticking-out part of the second sidewall in relation to the first sidewall is subject to a high-temperature oxidization; and the first sidewall and the second sidewall constitute a first etched portion which exposes a fraction of the first dielectric layer.

24. The manufacturing method according to claim 23, further comprising:
   forming on the second conductive pad an insulation layer, which covers the second conductive pad, the first sidewall and the second sidewall and exposes a fraction of the first conductive pad; and
   forming a conductive pillar, which has one terminal electrically connected to the second conductive pad, and has another terminal sticking out from an insulation layer conductive pad.

25. A light emitting diode load board, comprising:
   a substrate;
   a first dielectric layer formed on the substrate;
   a second dielectric layer formed on the first dielectric layer, the second dielectric layer comprising sinking sidewalls and protruding sidewalls, the sinking and protruding sidewalls constituting a first etched portion which exposes a fraction of the first dielectric layer;
   a first conductive pad formed on the exposed fraction of the first dielectric layer; and
   a second conductive pad formed on the second dielectric layer and not contacting the first conductive pad.

* * * * *